United States Patent [19]

Moulding

[11] Patent Number: 4,952,891
[45] Date of Patent: Aug. 28, 1990

[54] FILTER CIRCUIT WITH AUTOMATIC TUNING

[75] Inventor: Kenneth W. Moulding, Horley, England

[73] Assignee: U.S. Philips Corporation, New York, N.Y.

[21] Appl. No.: 441,354

[22] Filed: Sep. 22, 1989

[30] Foreign Application Priority Data

Oct. 21, 1988 [GB] United Kingdom ............... 8824756

[51] Int. Cl.$^5$ ............................................. H03H 11/04
[52] U.S. Cl. ................................. 333/17.1; 333/215
[58] Field of Search ............... 333/17.1, 215; 455/214, 455/337

[56] References Cited

U.S. PATENT DOCUMENTS

3,783,409  1/1974  Polson, Jr. .................... 333/17.1 X
3,997,856  12/1976  Canning et al. ................. 333/17.1

*Primary Examiner*—Paul Gensler
*Attorney, Agent, or Firm*—Bernard Franzblau

[57] ABSTRACT

A filter circuit (2) is automatically tuned so that the positions of the poles and zeros of its frequency response characteristic are maintained in substantially fixed ratios to an input frequency ($f_r$). The arrangement comprises a frequency discriminator (1) having its output (5) coupled to a controllable element (8) of a resonant circuit included therein, so that the resonant frequency of the resonant circuit is maintained equal to the input frequency. The output 5 also controls a counterpart (13) to element (8), which counterpart is included in an auxiliary circuit (3). The filter circuit is tuned by controlling an element (10) included therein, which element also has a counterpart element (14) included in the auxiliary circuit, both of these elements (10,14) being controlled by the auxiliary circuit output signal. The auxiliary circuit output signal is determined by the ratio between parameters of the respective counterpart elements (13,14), which correspond to parameters of the tuning elements (8,10) which govern the tuning frequencies, and acts to maintain this ratio, and hence the aforementioned ratios, substantially constant.

11 Claims, 5 Drawing Sheets

FILTER CIRCUIT WITH AUTOMATIC TUNING

BACKGROUND OF THE INVENTION

This invention relates to a filter circuit arrangement comprising a frequency discriminator for producing an output signal representative of the deviation (if any) of the frequency of an input signal thereto from the resonant frequency of a resonant circuit included in said discriminator, said resonant frequency being a function of the value of an electrical parameter of an element of the resonant circuit and being adjustable by applying an adjusting signal to an adjusting signal input of said resonant circuit to thereby adjust the value of said electrical parameter, a coupling extending from the output of the discriminator to the adjusting signal input for applying a signal to said adjusting signal input dependent on said deviation to adjust said resonant frequency towards that of the input signal, a filter circuit the position(s) of the pole(s) and/or zero(s) of the frequency response characteristic of which is/are a function of the value of an electrical parameter of an element of said filter circuit and is/are adjustable by applying an adjusting signal to an adjusting signal input of said filter circuit to thereby adjust the value of said electrical parameter of the element of said filter circuit, and a coupling from an output of the discriminator to the adjusting signal input of said filter circuit for applying an adjusting signal thereto to adjust said position(s) with the adjustment of the resonant frequency of the resonant circuit.

An arrangement of this general kind is known from e.g. GB-A-1421093, which corresponds to U.S. Pat. No. 3,947,856 (12/14/76) In this known filter arrangement the resonant circuit and the filter circuit are each in the form of a gyrator circuit having a variable capacitor connected across each port. The adjusting signals control the values of the variable capacitors (which are in the form of so-called varicaps) and hence the resonant frequencies (which are functions of said values). If several such arrangements are each constructed in integrated circuit form the adjustment of the resonant frequencies can compensate for the inevitable production spreads which occur in these frequencies from circuit to circuit. However it has been found that satisfactory results are difficult to obtain with this known arrangement if the resonant frequencies are in other than a simple integer ratio to each other. If the resonant frequencies are in a simple integer ratio of, for example, 2:1 no problem arises as, for example, the values of the capacitors in one resonant circuit can simply be made double that in the other, e.g. by connecting pairs of identically controlled identical capacitors in parallel in one circuit. (Making varicaps on an integrated circuit of equal value is a relatively easy thing to do whereas constructing pairs of single capacitors to have a specific capacitance ratio other than 1:1 is extremely difficult). However, if the resonant frequencies are in a more complicated ratio of, say, 1.7:1.0, each capacitor in one resonant circuit would have to be composed of seventeen parallel-connected capacitors whereas its counterpart in the other resonant circuit would have to be composed of ten parallel-connected capacitors, which would obviously occupy a large area of the surface of the IC chip. On the face of it an alternative way of achieving the required capacitance ratio would be to arrange that the adjusting signal applied to the varicaps of one resonant circuit be suitably attenuated relative to that applied to the varicaps of the other. However, this has been found to be unworkable in practice due to the non-linear relationship between the capacitance of a reverse-biassed p-n junction and the value of the reverse bias. It is an object of the present invention to mitigate this problem.

SUMMARY OF THE INVENTION

According to the invention an arrangement as defined in the first paragraph is characterized in that the latter coupling includes an auxiliary circuit which comprises first and second further elements which are counterparts of the said element of the resonant circuit and the said element of the filter circuit, respectively, a coupling extending from the auxiliary circuit input to an adjusting signal input of the first further element for applying an adjusting signal thereto to thereby adjust the corresponding parameter of the first further element in step with the adjustment of the said electrical parameter of the said element of the resonant circuit, means for deriving from the first and second further elements a signal dependent on the deviation (if any) of the ratio of the value of said corresponding parameter of the first further element to the value of the parameter of the second further element corresponding to the said electrical parameter of the said element of the filter circuit from a specific value and applying said signal to an adjusting signal input of the second further element to adjust said parameter of the second further element to thereby adjust said ratio towards said specific value, and a coupling from an output of said means to the auxiliary circuit output for adjusting the value of the said parameter of the said element of the filter circuit in step with the adjustment of the value of the said parameter of the second further element.

It has now been recognized that the detrimental effect of the aforesaid non-linear relationship can be substantially compensated for by including an auxiliary circuit of the kind specified in the coupling that extends between the discriminator output and the adjusting signal input of the filter circuit. The adjustment by the auxiliary circuit of the ratio between the said parameters of the first and second further elements towards the specific value results in a similar adjustment of the ratio between the corresponding parameters of the relevant elements of the resonant circuit and the filter circuit towards a given value (which is not necessarily the same as the specific value). Because the positions of the pole(s) and/or zero(s) of the frequency response characteristics of the latter circuits are functions of the values of these latter parameters the desired relationships between these positions can be automatically maintained.

Each counterpart element should be such that the ratio between the values of the said parameter thereof and the said parameter of the counterpart element included in the resonant or filter circuit is substantially independent of the value of the relevant adjusting signal. Achieving this can be facilitated if said element of said resonant circuit and said first further element are integrated on the same semiconductor chip, and said element of said filter circuit and said second further element are integrated on the same semiconductor chip.

Said means may conveniently comprise means for applying an a.c signal to said first and second further elements, means for deriving from said first and second further elements respective corresponding a.c. signals having amplitudes which are functions of the value of said parameter of the first further element and the value of said parameter of the second further element respectively, and a signal multiplier circuit for effectively multiplying said a.c. signal by, at least effectively, a combination of said corresponding a.c. signals in which one a.c. signal component is in antiphase to the other. The phase of the combination relative to that of the original a.c. signal will then depend on which amplitude is the greater, and hence on whether the ratio between the said parameters of the first and second further elements is greater or less than a given amount, this information being contained in the output signal of the multiplier circuit which may therefore be used to substantially equalise said amplitudes and hence adjust said ratio substantially to the given amount. In such a case said a.c. signal may conveniently be constituted by the input signal to the frequency discriminator.

Each said element may be constituted by a transconductance amplifier, each said parameter then being constituted by the transconductance of the relevant amplifier.

BRIEF DESCRIPTION OF THE DRAWINGS

Embodiments of the invention will now be described, by way of example, with reference to the accompanying diagrammatic drawings, in which.

DESCRIPTION OF THE PREFERRED EMBODIMENTS

Figure 1:
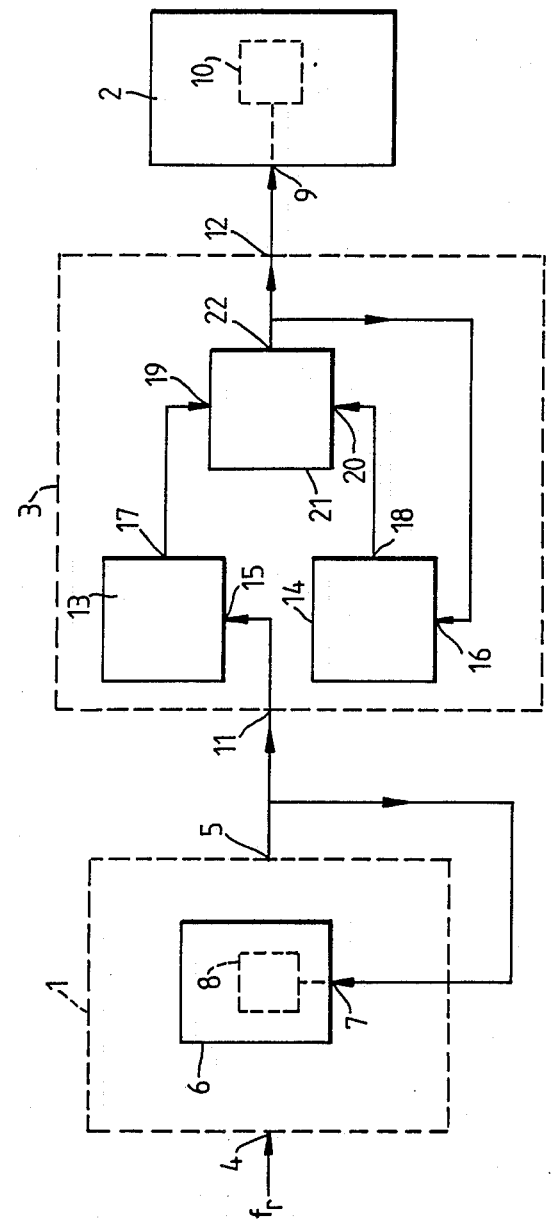
FIG. 1 is a block diagram of a first embodiment.

In FIG. 1 a filter circuit arrangement comprises a frequency discriminator 1, a filter circuit 2 and an auxiliary circuit 3. An input signal of frequency $f_r$ is applied to an input 4 of discriminator 1 and discriminator 1 in response produces an output signal at an output 5, the output signal being representative of the deviation (if any) of the frequency $f_r$ from the resonant frequency $f_o$ of a resonant circuit 6 included in discriminator 1. Thus the value of the output signal may be, for example, equal to $K(f_r-f_o)$, where K is a constant. The resonant frequency $f_o$ is a function of the value of an electrical parameter of an element 8 of resonant circuit 6, and the output 5 is coupled to an adjusting signal input 7 of the resonant circuit 6 so that the output signal adjusts the value of said electrical parameter. The adjustment is arranged to be in a sense such as to reduce the frequency difference $(f_r-f_o)$, so that the resonant frequency $f_o$ is controlled to be substantially equal to the frequency $f_r$ of the input signal. Tracking filters of this kind are well-known in the art.

The output 5 is also coupled to an adjusting signal input 9 of filter circuit 2 to adjust the value of an electrical parameter of an element 10 of filter circuit 2. The position(s) of the pole(s) and/or zero(s) of the frequency response characteristic of filter circuit 2 are a function of this value, with the result that said position(s) is/are adjusted with the adjustment of the resonant frequency $f_o$. The elements 8 and 10 could be, for example, variable-capacitance capacitors included in the resonant circuit 6 and the filter circuit 2 respectively, as in specification GB-A-1421093 cited previously. If filter circuit 2 is, for example, a resonant circuit nominally identical to resonant circuit 6, the coupling from output 5 to input 9 could in principle be a simple direct connection, as is effectively the case in GB-A-1421093, the resonant frequency of the filter circuit 2 then being adjusted automatically to be substantially equal to the frequency $f_r$. However, if this is not the case then, as pointed out previously, the adjustment of filter circuit 2 is liable to be subject to unacceptable errors if the values of the characteristic-determining parameters of the elements 8 and 10 are not linearly related to the value of the adjusting signal produced at output 5. The auxiliary circuit 3 is accordingly provided in the coupling from output 5 to input 9, its input 11 being connected to output 5 and its output 12 being connected to input 9.

Auxiliary circuit 3 comprises first and second further elements 13 and 14 which are counterparts of the elements 8 and 10 respectively. The input 11 of the auxiliary circuit 3 is coupled to an adjusting signal input 15 of element 13 to adjust the value of that parameter of element 13 which corresponds to the frequency characteristic-determining parameter of element 8 in step with the adjustment of said frequency characteristic-determining parameter. The element 14 also has an adjusting signal input 16 via which the value of that parameter of element 14 which corresponds to the frequency characteristic-determining parameter of element 10 can be adjusted. Outputs 17 and 18 of elements 13 and 14, respectively, are coupled to inputs 19 and 20, respectively, of further means 21 also included in auxiliary circuit 3. Means 21 is arranged to generate at an output 22 thereof a signal which depends on the deviation (if any) of the ratio of the value of the said parameter of element 13 to the value of the said parameter of element 14 from a specific value. This signal is applied to the adjusting signal input 16 of element 14 to adjust the value of the parameter of element 14 in such a sense as to reduce this deviation and thereby adjust the ratio to be substantially equal to the specific value, and is also applied to the adjusting signal input 9 of filter circuit 2, so that the value of the frequency characteristic-determining parameter of element 10 is adjusted in step with the value of the parameter of element 14. The total result is therefore that the ratio between the values of the frequency characteristic-determining parameters of the element 8 and the element 10 is automatically adjusted to be substantially equal to a given value, so that the positions) of the pole(s) and/or zero(s) of the frequency characteristic of filter circuit 2 are adjusted to be in a specific relationship (determined by the given value) to the resonant frequency $f_o$ and hence the reference frequency $f_r$. The elements 8 and 13 are preferably integrated on the same semiconductor chip, as are the elements 10 and 14.

Figure 2:
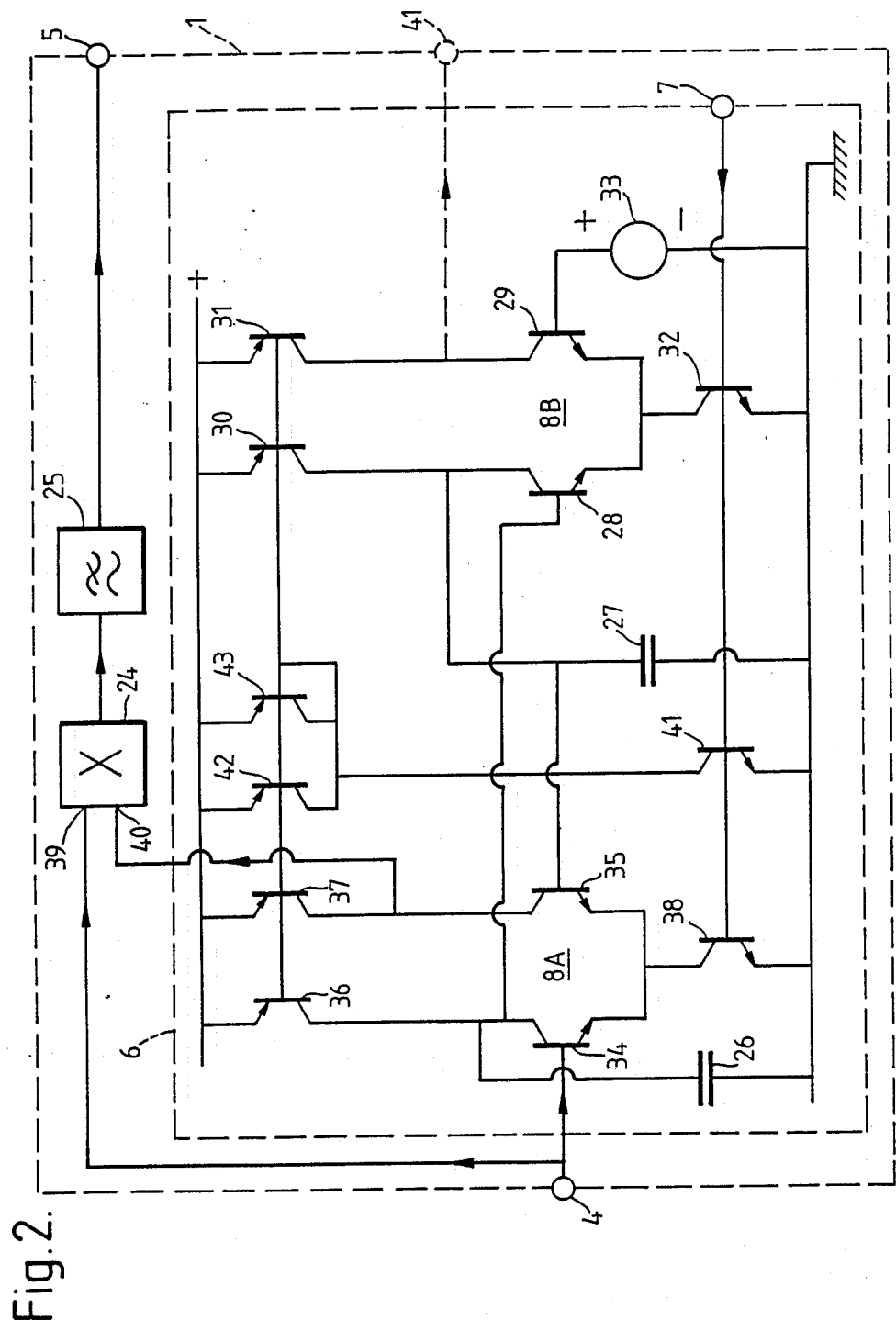
FIG. 2 and FIG. 3 show possible constructions for various blocks of FIG. 1 in more detail.

FIG. 2 shows a possible construction for the frequency discriminator 1 of FIG. 1. The discriminator 1 comprises a parallel resonant circuit 6, a four-quadrant signal multiplier 24 and a low-pass filter circuit 25. Resonant circuit 6 is in the form of a gyrator circuit having a capacitor, 26 and 27 respectively, connected across each port. The gyrator circuit comprises a pair of transconductance amplifiers 8A and 8B, one of which (8B) is inverting and one of which (8A) is non-inverting, with the output of each connected to the input of the other. The inverting amplifier 8B comprises a long-tailed pair of identical transistors 28 and 29 the collector loads of which are in the form of identical current source transistors 30 and 31, respectively, and the tail of which is formed by a current source transistor 32. The input of this amplifier is constituted by the base of transistor 28 and the output is constituted by the collector of transistor 28. The base of transistor 29 is fed with a constant voltage from a source 33. The non-inverting amplifier 8A likewise comprises a long-tailed pair of identical transistors 34 and 35 the collector loads of which are in the form of identical current source transistors 36 and 37, respectively, and the tail of which is formed by a current source transistor 38. The input of this amplifier is constituted by the base of transistor 35 and the output is constituted by the collector of transistor 34. The discriminator input is connected to the base of transistor 34. Each of the transconductance amplifiers 28-33 and 34-38 constitutes an element similar to element 8 of FIG. 1 in that a parameter thereof, in the present case its transconductance, is variable, and the resonant frequency of the resonant circuit is a function of (in the present case proportional to the square root of) this transconductance. The transconductances are adjustable by adjusting the base bias voltages of the tail transistors 32 and 8, and hence the tail currents of the transistor pairs 28,29 and 34,35. The bases of the tail transistors 32 and 38 are connected to the adjusting signal input 7. In order to maintain the total current supplied by the collector load transistors 30 and 31 equal to the current in the tail transistor 32, and the total current supplied by the collector load transistors 36 and 37 equal to the current in the tail transistor 38, a further transistor 41 is provided having its base-emitter path connected in parallel with the base-emitter paths of the transistors 32 and 38. This transistor is identical to the transistors 32 and 38, so that the collector currents of all three transistors will be equal to each other. The collector current of transistor 41 is applied to two parallel diode-connected transistors 42 and 43 which are each identical to the transistors 30,31,36 and 37, and which have their base-emitter paths connected in parallel with those of these transistors. The resulting current mirror action gives the desired result.

The input 4 is also connected to one input 39 of the multiplier 24, the other multiplier input 40 being fed from the collector of transistor 35. At resonance the signal at the collector of transistor 35 is 90° out of phase with that at input 4, and deviates therefrom otherwise, so that multiplier 24 produces in known manner an output signal which is representative of the deviation of the frequency of a signal applied to input 4 from the resonant frequency of circuit 6, this signal being smoothed by low pass filter 25 and applied to output 5. If desired a band-pass filtered version of the signal applied to input 4 may be taken off from the collector of transistor 29 via a further output 41.

The filter circuit 2 of FIG. 1 may, for example, be constructed similarly to the resonant circuit 6 of FIG. 2, its input corresponding to terminal 4 (the base of transistor 34), its output corresponding to terminal 41, and its adjusting signal input 9 corresponding to terminal 7. If this is the case each of the transconductance amplifiers corresponding to amplifiers 28-33 and 34-38 will constitute an element similar to element 10 of FIG. 1 in that a parameter thereof, in the present case its transconductance, is variable, and the position(s) of the pole(s) and/or zero(s) of the frequency response characteristic of the filter (bandpass in the present case) is/are a function of (in the present case proportional to the square root of) this transconductance. As an alternative the filter output may, for example, be taken from a point corresponding to the collector of transistor 35 in FIG. 2, and suitably valued damping resistors may be connected across the capacitors corresponding to capacitors 26 and 27 of FIG. 2, in which case a low pass characteristic will be obtained the position(s) of the pole(s) and/or zero(s) of which are again proportional to the square roots of the transconductances of the amplifiers corresponding to amplifiers 28-33 and 34-38 of FIG. 2.

Figure 3:
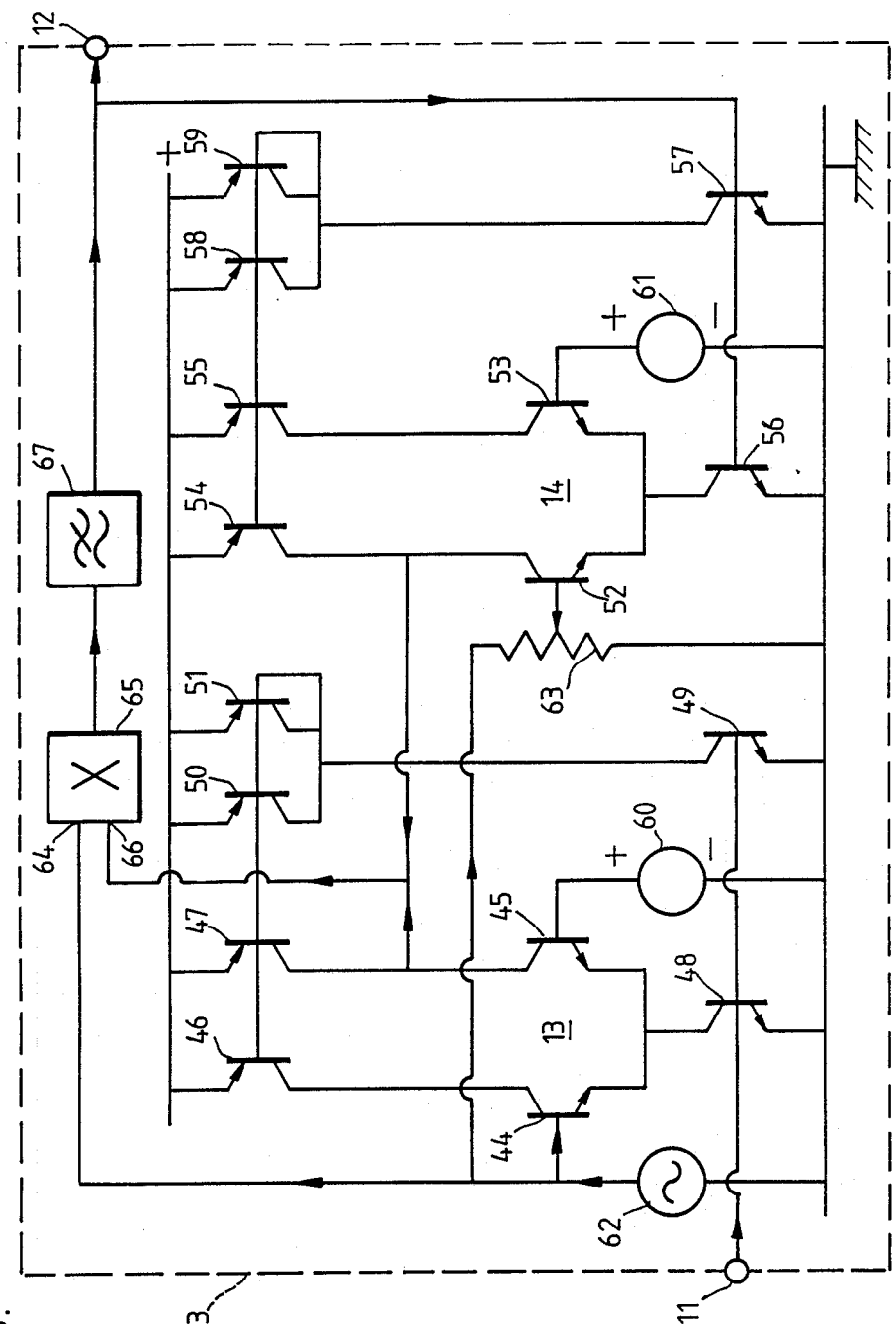

If discriminator 1 of FIG. 1 is constructed as described with reference to FIG. 2, and filter 2 of FIG. 1 is constructed as described in the preceding paragraph, the auxiliary circuit 3 of FIG. 1 may, for example, be constructed as shown in FIG. 3. The circuit 3 of FIG. 3 includes a counterpart of the transconductance amplifiers 8A and 8B of FIG. 2 and a counterpart of the corresponding transconductance amplifiers in the construction described for the filter 2 of FIG. 1 in that it includes variable-transconductance amplifiers 13 and 14 respectively. Similarly to, say, transconductance amplifier 8B, transconductance amplifier 13 comprises a long-tailed pair of identical transistors 44 and 45 the collector loads of which are in the form of identical current source transistors 46 and 47, respectively, and the tail of which is formed by a current source transistor 48. The transconductance is adjustable by adjusting the base bias voltage of the tail transistor 48 and hence the tail current of the transistor pair 44,45. A transistor 49 identical to transistor 48, and two further transistors 50 and 51 identical to transistors 46 and 47 perform the same function as the transistors 41-43 in FIG. 2 in that they maintain the total current supplied by the collector load transistors 46 and 47 equal to the current in the tail transistor 48. Transconductance amplifier 14 likewise comprises a long-tailed pair of identical transistors 52 and 53 the collector loads of which are in the form of identical current source transistors 54 and 55, respectively, and the tail of which is formed by a current source transistor 56. The transconductance is adjustable by adjusting the base bias voltage of the tail transistor 56 and hence the tail current of the transistor pair 52,53. A transistor 57 identical to transistor 56, and two further transistors 58 and 59 identical to transistors 54 and 55 perform a similar function to the transistors 49-51 in that they maintain the total current supplied by the collector load transistors 54 and 55 equal to the current in the tail transistor 56. The auxiliary circuit input 11 is connected to the base of transistor 48.

The bases of transistors 45 and 53 are fed with d.c. reference voltages by means of d.c. voltage sources 60 and 61, respectively, whereas the bases of the transistors 44 and 52 are fed with the output of an arbitrary a.c. voltage source 62, the base of transistor 52 via a variable attenuator or potential divider 63. Source 62 may in fact be constituted by the source which supplies the signal of frequency $f_r$ to the input terminal 4 of the frequency discriminator 1 of FIG. 2, and its output signal is also applied to a first input 64 of a four-quadrant signal multiplier 65 the second input 66 of which is fed from the commoned collectors of the transistors 45 and 52. The output signal of multiplier 65 is smoothed by means of a low-pass filter 67 and applied both to the auxiliary circuit output 12 and to the base of transistor 56.

It will be noted that amplifier 13 is non-inverting from the base of transistor 44 to the collector of transistor 45, whereas amplifier 14 is inverting from the base of transistor 52 to its collector, so that the output signals of source 62 as applied to multiplier input 66 via the amplifiers 13 and 14, respectively, are in antiphase. If the gain from source 62 to multiplier input 66 via amplifier 13 is greater than that via amplifier 14 the signals applied to the two inputs of multiplier 65 will be in phase, so that the multiplier output signal will be positive, increasing the forward bias of transistor 56 and hence the transconductance of amplifier 14. Conversely, a situation where the gain via amplifier 13 is less than that via amplifier 14 will result in a negative output from multiplier 65 and hence a reduction in the transconductance of amplifier 14. (The multiplier output signal may, for example, be arranged to have a differential form and be coupled to filter 67 via a differential-to-single-ended converter). Thus the loop including multiplier 65 and filter 67 acts to equalize the gains via the amplifiers 13 and 14 Adjustment of the tap of potentiometer 63 in a direction such as to increase the attenuation produced thereby therefore results in an increase in the transconductance of amplifier 14 and also in the control signal applied via output 12 to the transconductors of filter circuit 2, whereas adjustment of the tap in the opposite direction results in a decrease in said transconductance and hence also that of the transconductors included in filter circuit 2. The ratio between the transconductances of the amplifiers 13 and 14 is therefore determined by the setting o: potentiometer 63, and is maintained substantially at the set value by the control loop including multiplier 65 and filter 6? . Because the transconductor 13 is adjusted by the same signal which adjusts the transconductors in resonant circuit 6, and the transconductors in filter circuit 2 are adjusted by the same signal which adjusts the transconductor 14, the ratio of the transconductances of the transconductors in filter circuit 2 to the transconductances of the transconductors in resonant circuit 6 is also determined by the setting of potentiometer 63 Thus the frequencies at which the poles and zeros occur in the frequency response of filter 2 are maintained in a substantially constant ratio to the resonant frequency of filter 6, and hence to the input frequency $f_r$, this ratio being determined by the setting of potentiometer 63 (which may, for example, be electronically variable).

It should be noted that the transconductors 8A, 8B and 13 need not be identical, and the same comment applies to transconductor 14 and the transconductors included in filter circuit 2. All that is required is that they be constructed so that the ratios between the transconductances of transconductors 8A and 8B and the transconductance of transconductor 13 are substantially independent of the value of their common adjusting signal, and the ratios between the transconductances of the transconductors included in filter circuit 2 and the transconductance of transconductor 14 are likewise substantially independent of the value of their common adjusting signal.

Although the invention has been described so far in the context of arrangements employing gyrator-capacitor resonant circuits and filters in which the gyrators are composed of transconductance amplifiers and the position(s) of the pole(s) and/or zero(s) of the frequency response characteristics are adjusted by adjusting the transconductances of the amplifiers, the invention is not limited thereto. As a first alternative the resonant circuit and/or filter may be a so-called transconductor-capacitor resonant circuit or filter a simple example of which is shown in outline form in FIG. 4.

Figure 4:
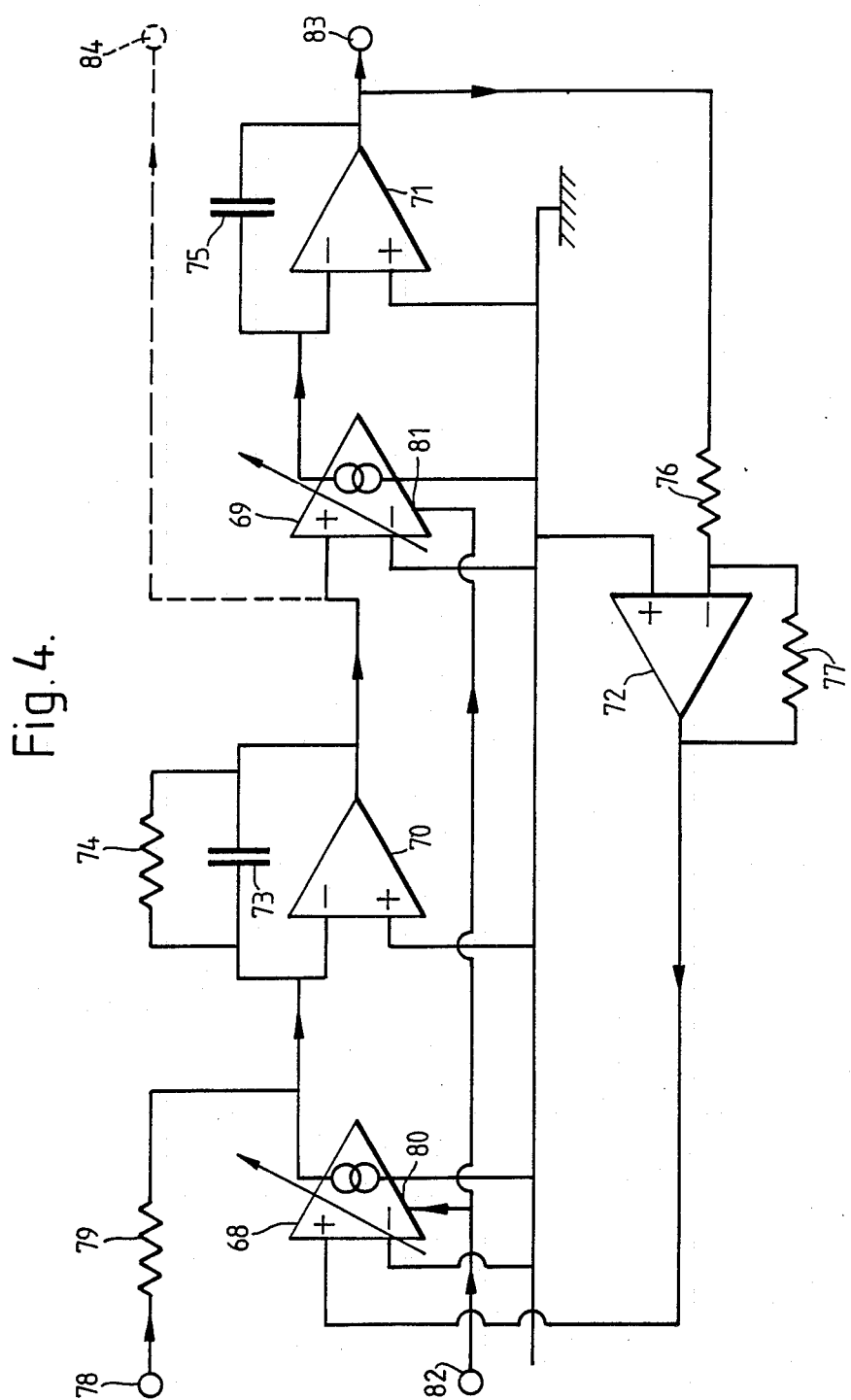
FIG. 4 shows a possible alternative to a part of FIG. 2, and FIG. 5 and FIG. 6 show possible alternative constructions for one of the blocks of FIG. 1.

The resonant circuit or filter circuit shown in FIG. 4 comprises two non-inverting variable-transconductance transconductance amplifiers 68 and 69 and three high-gain inverting voltage amplifiers 70,71 and 72. Amplifier 70 has both a capacitor 73 and a resistor 74 connected between its output and its input so that it effectively constitutes an active leaky capacitor circuit. Amplifier 71 has a capacitor 75 connected between its output and its input so that it effectively constitutes an active capacitor circuit. Amplifier 72 has a resistor 76 connected in series with its input and a resistor 77 of the same value connected between its output and its input, so that overall a unity gain inverter is formed. Transconductance amplifier 68, leaky capacitor circuit 70,73,74, transconductance amplifier 69, capacitor circuit 71,75, and unity-gain inverting amplifier circuit 72,76,77 are connected in a loop as shown. A signal input 78 is connected to the input of circuit 70,73,74 via a series resistor 79, and transconductance adjusting signal inputs 80 and 81 of the amplifiers 68 and 69, respectively, are fed from an adjusting signal input 82. If the circuit of FIG. 4 replaces the resonant circuit 6 of FIG. 2 an output terminal 83 should be connected to the input 40 of the multiplier 24 and the value of the (Q-determining) resistor 74 should be chosen comparatively high. Terminal 78 should be connected to terminal 4 and terminal 82 corresponds to terminal 7. Terminal 83 should likewise be employed as the output terminal if the circuit of FIG. 4 is employed as the resonant or filter circuit 2 of FIG. 1 and a low-pass characteristic is required, in which case the value of resistor 74 should be chosen comparatively low. In this case terminal 82 corresponds to input 9 of FIG. 1. If, on the other hand, a band-pass characteristic is required a terminal 84 (shown dashed) should be employed as the output terminal. In all cases auxiliary circuit 3 may be constructed as described with reference to FIG. 3, transconductance amplifier 13 constituting a counterpart to the amplifiers 68 and 69 included in resonant circuit 6, and transconductance amplifier 14 constituting a counterpart to the amplifiers 68 and 69 included in filter circuit 2.

The variable transconductance amplifiers 68 and 69 of FIG. 4 in effect each constitute an active form of variable resistor included in series with the signal input to the following active capacitor circuit and may in consequence each be replaced by some other circuit element which has the property of a variable series resistor. Thus each may, for example, be replaced by a field-effect transistor (FET) having its source-drain path included in series with the signal input to the relevant active capacitor circuit and its gate controlled by the adjusting signal applied to input 82. If this is done then counterparts of these transistors will have to be provided in the auxiliary circuit 3, which may then take the form outlined in FIG. 5.

Figure 5:
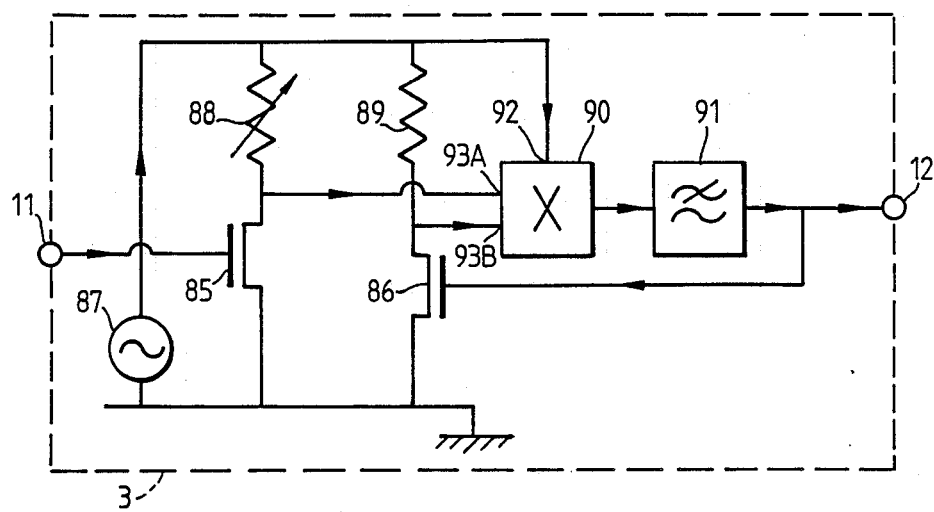

The construction for the auxiliary circuit 3 shown in FIG. 5 comprises a FET 85 which constitutes a counterpart to the said FETs included in resonant circuit 6, and a FET 86 which constitutes a counterpart to the said FETs included in filter circuit 2. The sources of these FETs are connected to ground, and their drains are connected to the output of an a.c. signal source 87 via a variable resistor 88 and a fixed resistor 89 respectively. Source 87 may, in the same way as source 62 of FIG. 3, be constituted by the source which supplies the signal of frequency $f_r$ to the input 4 of discriminator 1 in FIG. 1. Similarly to the construction shown in FIG. 3, the circuit 3 of FIG. 5 includes a four-quadrant signal multiplier 90 the output of which is coupled to the output terminal 12 via a low-pass filter 91. A first input 92 of multiplier 90 is fed from the source 87 and the other, in this case differential, input 93A,93B of multiplier 90 is fed from the junction point of transistor 85 and resistor 88 and the junction point of transistor 86 and resistor 89. The input terminal 11 is connected to the gate of transistor 85 and the gate of transistor 86 is fed from the output of low-pass filter 91. If the ratio of the resistance of transistor 85 to that of resistor 88 is, for example, greater than the ratio of the resistance of transistor 86 to that of resistor 89, the signal at multiplier input 93A relative to that at multiplier input 93B will be in-phase with that at multiplier input 92. Multiplier 90 is constructed to produce a negative output under these circumstances, which reduces the gate voltage of transistor 86 and hence increases its resistance to thereby increase the latter ratio. Conversely, if the ratio of the resistance of transistor 85 to that of resistor 88 is less than the ratio of the resistance of transistor 86 to that of resistor 89, the signal at multiplier input 93A relative to that at multiplier input 93B will be in antiphase to that at multiplier input 92. Multiplier 90 therefore produces a positive output under these circumstances, which increases the gate voltage of transistor 86 and thereby decreases the latter ratio. Thus the loop including multiplier 90 and low-pass filter 91 acts to equalize the said ratios and therefore to maintain the resistances of the source-drain paths of the transistors 85 and 86 themselves in a specific ratio determined by the setting of variable resistor 88. Therefore the resistances of the source-drain paths of the FETs included in resonant circuit 6 are themselves maintained in a specific ratio to the resistances of the source-drain paths of the FETs included in filter circuit 2. Thus the position(s) of the pole(s) and/or zero(s) of the frequency response characteristic of filter circuit 2 is/are maintained in a specific ratio to the resonant frequency of resonant circuit 6 as required, because said positions and said resonant frequency are functions of the relevant resistances (in fact again proportional to the square root of each).

It will be appreciated that, for the exemplary constructions described for the resonant circuit 6 and the filter circuit 2, (and for many other possible constructions therefor), the positions of the pole(s) and/or zero(s) of the frequency response characteristics are also functions of the capacitances of the capacitive elements of these constructions. Said positions may therefore be alternatively adjusted by adjusting the values of these capacitances, for example by forming the capacitors in known manner by means of reverse-biassed semiconductor junctions and adjusting the values of the reverse biasses. Tuning of filters in this way is well known in the art. If such an adjustment facility is arranged to replace the adjustment facility already described then the auxiliary circuit 3 may take the form outlined in FIG. 6.

Figure 6:
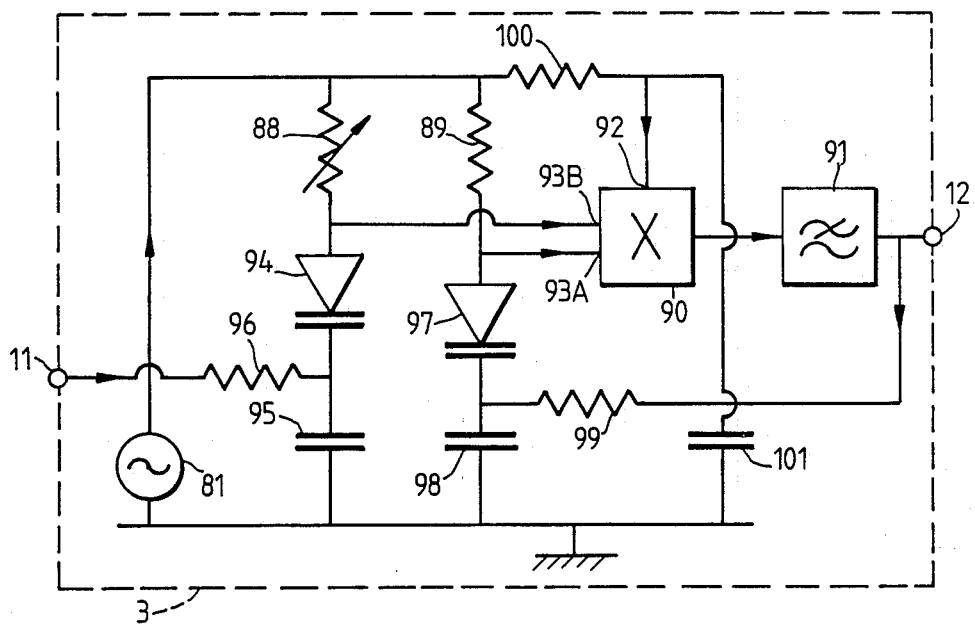

The construction outlined in FIG. 6 is very similar to that outlined in FIG. 5 and the same references have been given to corresponding components in the two Figures. FIG. 6 differs from FIG. 5 in that FET 85 has been replaced by a varicap 94 having a relatively large-capacitance decoupling capacitor 95 in series with it, the common point of these elements being fed from adjusting signal input 11 via a decoupling resistor 96, FET 86 has been replaced by a varicap 97 having a relatively large-capacitance decoupling capacitor 98 in series with it, the common point of these elements being fed from the output of low-pass filter 91 via a decoupling resistor 99, and the input connections 93 to multiplier 90 have been reversed. Varicap 94 constitutes a counterpart of the tuning varicaps now included in resonant circuit 6 and varicap 97 constitutes a counterpart of the tuning varicaps now included in filter circuit 2. Because of the large capacitances of capacitors 95 and 98 the capacitance of the series combination 94,95 is substantially equal to that of varicap 94, and the capacitance of series combination 97,98 is substantially equal to that of varicap 97. The input connections 93 to multiplier 90 have been reversed relative to FIG. 5 because if, for example, the ratio of the impedance of series combination 94,95 to that of resistor 88 is greater than the ratio of the impedance of the series combination 97,98 to that of resistor 89 the impedance of a varicap must be increased, i.e. the reverse bias voltage applied to its cathode must be made more positive. In order to produce a phase shift in the signal applied to the input 92 of multiplier 90 in view of the phase shifts occurring in the signal paths to its input 93, a resistor 100 is included in series with the input 92, the output end of this resistor being connected to ground via a capacitor 101.

Similarly to the variable transconductors of FIG. 3 and the FETs of FIG. 5, it is not necessary that variable capacitor 94 in FIG. 6 be identical to its counterparts in resonant circuit 6, merely that the ratio between the capacitances be substantially independent of the value of the common adjusting signal applied thereto. A similar comment applies to varicap 97 and its counterparts in filter circuit 2.

If, as will often be the case, the variable capacitors in resonant circuit 6 and filter circuit 2 are each formed in known manner, by a pair of varicaps connected back-to-back with an adjustable reverse bias voltage applied to the common point of the varicaps of each pair, the arrangement of FIG. 6 should be modified by replacing each decoupling capacitor 95,98 by a varicap poled in such a manner that its anode is connected to the chassis.

In the embodiments of the invention so far described, in which each resonant circuit 6 and each filter circuit 2 comprises two transconductance amplifiers or field-effect transistors and two capacitances, both amplifiers or FETs, or both capacitances, are controlled by a common adjusting signal. Although this is preferred it is not necessarily the case; it may be arranged that only one of the two amplifiers or FETs, or one of the two capacitances, is controlled by the relevant adjusting signal if desired. Moreover it will be evident that the invention is also applicable to arrangements in which the resonant circuit 6 and/or the filter circuit 2 takes a form other than one which comprises two transconductance amplifiers or field-effect transistors and two capacitances. Thus, for example, filter circuit 2 may comprise a simple series R parallel C low-Pass filter in which the value of the series R or the parallel C is adjusted by the relevant adjusting signal, the series R being formed by e.g. a controller FET or combination of FETs, or the parallel C being formed by a controlled varicap or combination of varicaps as desired. Combinations of controlled FETs which are interconnected in such a way as to reduce distortion which would otherwise be produced thereby are known per se.

From reading the present disclosure, other modifications will be apparent to persons skilled in the art. Such modifications may involve other features which are already known in the design, manufacture and use of filters and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

I claim:

1. A filter circuit arrangement comprising: a frequency discriminator for producing an output signal representative of a deviation of the frequency of an input signal thereto from the resonant frequency of an input signal thereto from the resonant frequency of a resonant circuit included in said discriminator, said resonant frequency being a function of the value of an electrical parameter of an element of the resonant circuit and being adjustable by applying an adjusting signal to an adjusting signal input of said resonant circuit to thereby adjust the value of said electrical parameter, means coupling an output of the discriminator to the adjusting signal input for applying a signal to said adjusting signal input dependent on said deviation to adjust said resonant frequency towards the frequency of the input signal, a filter circuit wherein the position(s) of the pole(s) and/or zero(s) of the frequency response characteristics is/are a function of the value of an electrical parameter of an element of said filter circuit and is/are adjustable by applying an adjusting signal to an adjusting signal input of said filter circuit to thereby adjust the value of said electrical parameter of said element of the filter circuit, and an auxiliary circuit having an input coupled to the discriminator output and an output coupled to said filter circuit adjusting signal input for coupling the output of the discriminator to the adjusting signal input of said filter circuit for applying an adjusting signal thereto to adjust said position(s) with the adjustment of the resonant frequency of the resonant circuit, characterized in that the auxiliary circuit comprises first and second further elements which are counterparts of said element of the resonant circuit and said element of the filter circuit, respectively, means for coupling the auxiliary circuit input to an adjusting signal input of the first further element for applying an adjusting signal thereto to thereby adjust a corresponding parameter of the first further element in step with the adjustment of said electrical parameter of said element of the resonant circuit, means for deriving from the first and second further elements a signal dependent on a deviation of the ration of the value of said corresponding parameter of the first further element to the value of a parameter of the second further element, corresponding to the electrical parameter of said element of the filter circuit, from a specific value and applying said signal to an adjusting signal input of the second further element to adjust said ratio towards said specific value, and means for coupling an output of said signal deriving means to the auxiliary circuit output for adjusting the value of said parameter of said element of the filter circuit in step with the adjustment of the value of said parameter of the second further element.

2. An arrangement as claimed in claim 1, wherein each said element comprise a transconductance amplifier and each said electrical parameter is the transconductance of the relevant amplifier.

3. An arrangement as claimed in claim 1, wherein each said element comprises a field-effect transistor or combination of field-effect transistors, and each said electrical parameter is the effective resistance of said transistor or combination of transistors.

4. An arrangement as claimed in claim 1, wherein each said element comprises a variable-capacitance diode or combination of variable-capacitance diodes, and each said electrical parameter is the effective capacitance of said diode or combination of diodes.

5. An arrangement as claimed in claim 1, wherein said element of said resonant circuit and said first further element are integrated on the same semiconductor chip, and said element of said filter circuit and said second further element are integrated on the same semiconductor chip.

6. An arrangement as claimed in claim 5, wherein said signal deriving means comprises means for applying an a.c. signal to said first and second further elements, means for deriving from said first and second further elements respective corresponding a.c. signals having amplitudes which are functions of the value of said parameter of the first further element and the value of said parameter of the second further element respectively, and a signal multiplier circuit for effectively multiplying said a.c. signal by, at least effectively, a combination of said corresponding a.c. signals in which one component is in antiphase to the other.

7. An arrangement as claimed in claim 1, wherein said signal driving means comprises means for applying an a.c. signal to said first and second further elements, means for deriving from said first and second further elements respective corresponding a.c. signals having amplitudes which are functions of the value of said parameter of the first further element and the value of said parameter of the second further element respectively, and a signal multiplier circuit for effectively multiplying said a.c. signal by, at least effectively, a combination of said corresponding a.c. signals in which one component is in antiphase to the other.

8. An arrangement as claimed in claim 7, wherein said a.c. signal comprises the input signal to the frequency discriminator.

9. An arrangement as claimed in claim 7, wherein each said element comprises a transconductance amplifier and each said electrical parameter is the transconductance of the relevant amplifier.

10. An arrangement as claimed in claim 7, wherein each said element comprises a field-effect transistor or combination of field-effect transistors, and each said electrical parameter is the effective resistance of said transistor or combination of transistors.

11. An arrangement as claimed in claim 7, wherein each said element comprises a variable-capacitance diode or combination of variable-capacitance diodes, and each said electrical parameter is the effective capacitance of said diode or combination of diodes.

* * * * *

UNITED STATES PATENT AND TRADEMARK OFFICE
CERTIFICATE OF CORRECTION

PATENT NO. : 4,952,891

DATED : August 28, 1990

INVENTOR(S) : KENNETH W. MOULDING

It is certified that error appears in the above-identified patent and that said Letters Patent is hereby corrected as shown below:

Column 1, line 33, change "3,947,856" to --3,997,856--.

Column 3, line 13, change "amPlitudes" to --amplitudes--.

Signed and Sealed this

Seventh Day of January, 1992

Attest:

HARRY F. MANBECK, JR.

*Attesting Officer*    *Commissioner of Patents and Trademarks*

UNITED STATES PATENT AND TRADEMARK OFFICE
CERTIFICATE OF CORRECTION

PATENT NO. : 4,952,891

DATED : August 28, 1990

INVENTOR(S) : KENNETH W. MOULDING

It is certified that error appears in the above-identified patent and that said Letters Patent is hereby corrected as shown below:

```
Claim 1, column 11, line 12, delete "an";
                    line 13, delete "input signal thereto from the
                             resonant frequency of";
                    line 50, change "ration" to --ratio--;
                    line 57, before "ratio" insert --parameter of
                             the second further element to thereby
                             adjust said--.

Claim 2, column 12, line  2, change "comprise" to --comprises--.

Claim 7, column 12, line 34, change "driving" to --deriving--.
```

Signed and Sealed this

Seventeenth Day of March, 1992

*Attest:*

HARRY F. MANBECK, JR.

*Attesting Officer*     *Commissioner of Patents and Trademarks*